United States Patent [19]

Laiacona et al.

[11] Patent Number: 4,700,060

[45] Date of Patent: Oct. 13, 1987

[54] DEVICE FOR SELECTIVELY ROUTING AUDIO SIGNALS BIDIRECTIONALLY ALONG ONE OR TWO SIGNAL PATHS

[75] Inventors: Michael N. Laiacona; William Thompson, both of Webster; Carl L. Cornell, Rochester, all of N.Y.

[73] Assignee: Whirlwind Music Distributors, Inc., Rochester, N.Y.

[21] Appl. No.: 843,975

[22] Filed: Mar. 25, 1986

[51] Int. Cl.$^4$ .................. G02B 27/00; H01H 35/00
[52] U.S. Cl. .................. 250/214 R; 250/551; 307/117
[58] Field of Search ......... 250/206, 214 R, 214 SW, 250/551; 200/61.02; 307/117, 311; 361/173, 175, 176, 177

[56] References Cited

U.S. PATENT DOCUMENTS 4,176,401 11/1979 Lonberger ................ 250/551
4,320,388 3/1982 McCarthy et al. .......... 307/117

*Primary Examiner*—David C. Nelms
*Assistant Examiner*—S. Allen

*Attorney, Agent, or Firm*—Shlesinger Fitzsimmons Shlesinger

[57] ABSTRACT

The device includes an audio signal circuit having two separate terminals that are connected through the photoresistor elements of two, separate, optical isolators with an audio signal input/output terminal, so that signals can be routed selectively and bidirectionally along separate signal paths to or from the input/output terminal to one or both of the two separate terminals. A separate control circuit supplies DC power selectively to the LED's which control the selective energization of the photoresistor elements of the optical isolators, the advantage being that the photoresistive devices permit selective blocking of the audio signal paths without physically opening or interrupting the paths and thus avoiding objectionable signal spikes and consequent loud popping sounds in associated loud speaker systems. The DC control circuit includes two, manually operable double pole, double throw switches for controlling the selective routing of signals between the audio signal terminals.

17 Claims, 1 Drawing Figure

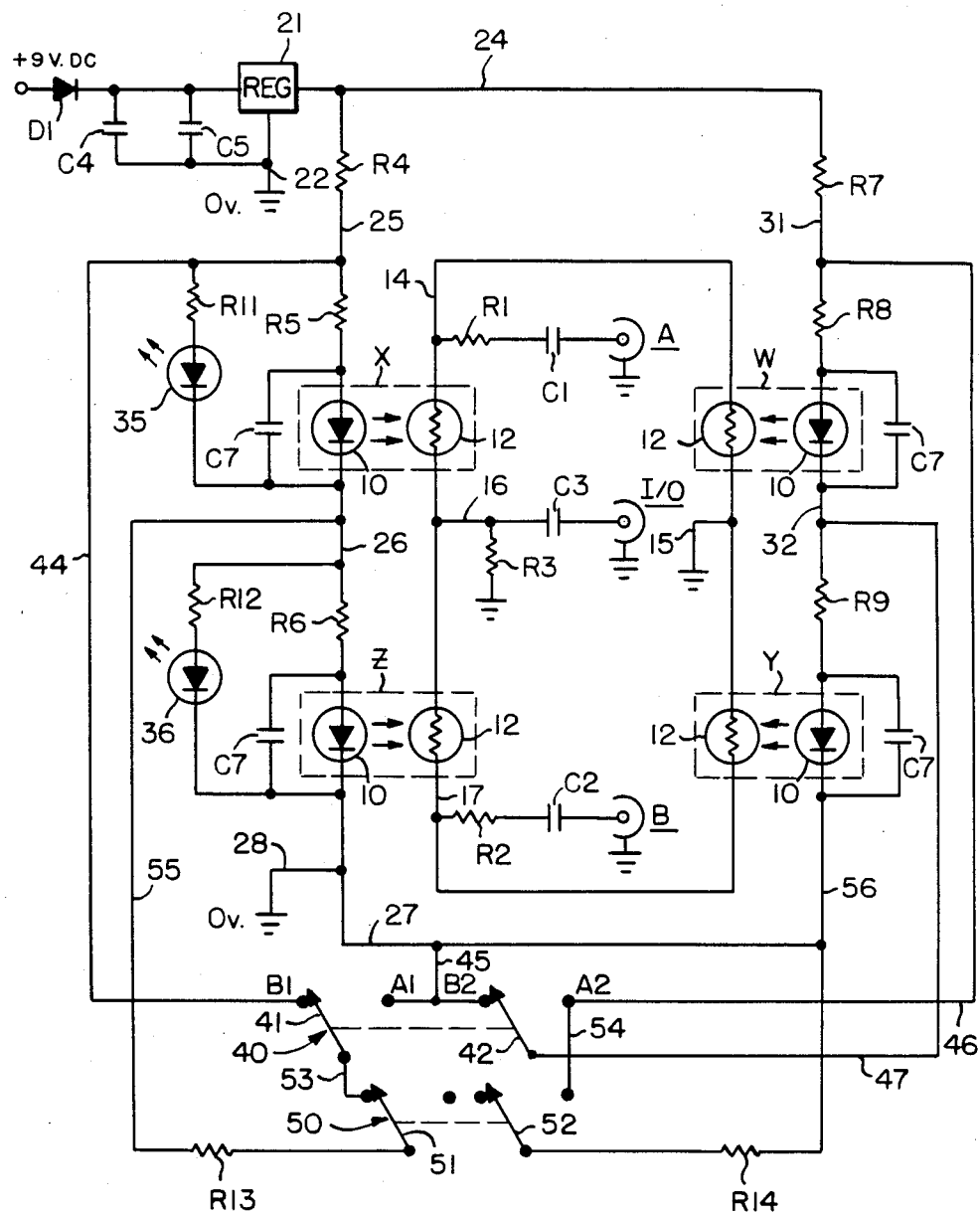

DEVICE FOR SELECTIVELY ROUTING AUDIO SIGNALS BIDIRECTIONALLY ALONG ONE OR TWO SIGNAL PATHS

BACKGROUND OF THE INVENTION

This invention relates to electrical switching devices, and more particularly to a device for switching audio signals from one circuit to another without causing any undesirable noise or signal spiking.

In order to introduce unusual sound features into their performances, musicians, and in particular those using electrical guitars, have in the past utilized a so-called A/B box, or similar switching device, for routing the audio signal from the instrument simultaneously or selectively through two different signal paths to an amplifier input, or the like. Typically the box includes two mechanical switches, one of which is operated to control the path of the output signal selectively through one path (A) or the other (B) to an In/Out port; the other of which is operable to route the signals simultaneously through both paths. Moreover, such boxes have also been designed to permit bi-directional routing of such signals to or from the In/Out port. In any case, however, the major disadvantage of such prior devices has been the tendency of the associated switches to generate undesirable signal or voltage spikes in the audio circuits whenever the associated switch is manipulated. The spikes in turn generate loud popping sounds in the associated speaker system; and for this reason boxes or switching devices of the type described have not heretofore achieved widespread acceptance.

It is an object of this invention, therefore, to provide an improved switching device of the type described which substantially eliminates the appearance of any undesirable signal spikes upon the interruption or switching of an audio signal from one circuit to another.

A more specific object of this invention is to provide an improved signal switching device of the type described which is suitable for use in a bi-directional manner for either combining or separating audio signals without introducing any undesirable spikes in the signals.

Other objects in the invention will be appearing hereinafter from the specification and from the recital of the appended claims, particularly when right in conjunction with the company drawing.

SUMMARY OF THE INVENTION

Two separate audio signal terminals are connected through the photo-resistor elements of two, separate, optical isolators with an audio signal input/output terminal so that signals can be routed selectively and bidirectionally to or from the input/output terminal to one or both of the two separate terminals. A separate control circuit supplies DC power selectively to the LED's which control the selective energization of the photoresistor elements of the optical isolators, the advantage being that the photo-resistive devices permit selective routing of the audio signals without producing objectionable signal spikes and consequently loud popping sounds in associated loud speaker systems. The DC control circuit includes two, manually operable double pole, double throw switches for controlling the selective routing of signals between the audio signal terminals.

THE DRAWING

FIG. 1, the only FIGURE in the drawing, is a wiring diagram illustrating an audio signal switching device made according to one embodiment of this invention.

DETAILED DESCRIPTION OF THE PREFERRED EMBODIMENTS

Referring now to the drawing by numerals and letters of reference, W,X,Y and Z each illustrate one of four optical isolators of the photo-resistive variety, and which, by way of example, may be of the type sold by Vactec Inc. under Model No. VTL 5C1. Each of the isolators is similar in configuration, and comprises a light emitting diode (LED) 10, and a highly resistive photocell 12 positioned adjacent the LED 10. Whenever the latter is conducting, or is energized, its illumination lowers the resistance of the associated photocell 12 to enable an audio signal to be passed through the photocell as noted hereinafter.

In the illustrated embodiment the photocells 12 of the isolators W,X,Y and Z are used to control the passage of audio signals between a plurality of terminals or receptables denoted in the drawing at A,B and I/O, respectively. The terminal A is connected through a capacitor C1 and a resistor R1 to a line 14, one end which is connected through the photocell 12 of the isolator W to the ground terminal 15, and the opposite end of which is connected through the photocell 12 of the isolator X to a line 16. The signal terminal B is also connected through a capacitor C2 and a resistor R2 to a line 17, one end of which is connected through the photocell 12 of the isolator Y to the ground terminal 15, and at its opposite end is connected through the photocell 12 of the isolator Z also to line 16. Therefore, as noted hereinafter, signals originating on terminals A and B can be applied by line 16 simultaneously to one side of a capacitor C3, and through a resistor R3 to ground. The opposite side of capacitor C3 is connected to the input/output signal terminal I/O. The photocell resistors 12 thus enable audio signals to be transmitted bi-directionally to or from the input/output terminal I/O. Also, as noted hereinafter, the signals can be routed selectively through the photocells 12 of the isolators X and Z either to or from the signal terminals A and B.

To control the signal flow through the above-described audio signal section of this novel switching device, the DC power supply on the order of 9 volts, such as for example supplied by a battery, is supplied through a diode D1 to one side of each of two capacitors C4 and C5, and to the input of a conventional voltage regulator 21. The opposite sides of the capacitors C4 and C5 are connected to a zero voltage ground terminal 22, while the output of the regulator, which is maintained at approximately 8 volts, is applied to a line 24. Line 24 is connected through a resistor R4, a line 25, and a resistor R5 to the anode of the LED 10 of the isolator X. The cathode of this LED 10 is connected in series by a line 26 and a resistor R6 with the anode of the LED 10 of the isolator Z, the cathode of which is connected to a line 27, which is grounded to zero volts as at 28.

Line 24 is also connected through a resistor R7, a line 31 and a resistor R8 with the anode of the LED 10 of the isolator W. The cathode of this LED is connected in series by a line 32 and a resistor R9 with the anode of LED 10 of the isolator Y. The cathode of the last-mentioned LED, as in the case of the isolator Z, is also connected to line 27.

Characteristic of an isolator of the type denoted at W,X,Y or Z is that, whenever the DC voltage is removed from its LED 10, as noted hereafter, the resistance of the associated photocell 12 does not jump or increase instantly from near zero to a high ohm value; and conversely, when the associated LED is energized, the illumination therefrom does not cause the resistance of the associated photocell 12 instantly to drop.

In order to increase this delay between the rise and fall of the photocell resistance, each of the LED's 10 has connected thereacross a capacitor C7, one side of which is connected to the anode and the other side to the cathode of the associated LED. Furthermore, to provide a visual indication of when the isolator X is energized, or conducting a resistor R11 and an LED 35 are connected in series between the lines 25 and 26, and in parallel with resistor R5, the capacitor C7, and its associated LED 10 of isolator X. Likewise, a resistor R12 and an LED 36 are connected in series between lines 26 and 27, and in parallel with the resistor R6, and capacitor C7, and the associated LED 10 of the isolator Z, so that when this latter isolator is energized the LED 36 will glow.

The above-described circuit is designed to permit audio signals to be transmitted selectively from the input/output terminal to the terminal A or B, or simultaneously to each of the terminals A and B. Alternatively signals can be applied from terminal A or B to the in/out terminal I/O, or simultaneously from termimals A and B to the in/out terminal. To effect this control, two manually operable gang switches, which are denoted generally at 40 and 50, respectively, are mounted on the box or housing containing this circuit. Switch 40 comprises two, pivotal, ganged switch arms or blades 41 and 42, which are mounted to pivot about spaced pivot points selectively between a first position in which the switch contacts 41 and 42 engage a pair of stationary terminals denoted at A1 and A2, respectively in the drawing, and a second position where, as shown in the drawing, they engage, respectively, a pair of spaced, stationary contacts B1 and B2. Contact B1 is connected by a line 44 to line 25; and contact B2 is connected by a line 45 to line 27. Contact A1, it will be noted, is also connected by line 45 to line 27; while contact A2 is connected by a line 46 to line 31. The pivotal end of switch arm 42 is connected by line 47 to line 32.

Switch 50 has two ganged arms or contacts 51 and 52, each of which pivots about one end thereof between a first position in which contact 51 is connected by a line 53 to the switch arm 41, and a second position in which switch arm 52 is connected by a line 54 to the terminal or contact A2 of switch 40. When switch 50 is in its first position its switch arm 52 is dead ended, and when in its second position, its arm 51 is dead ended. At its pivotal end switch arm 51 is connected through a resistor R13 and a line 55 to line 26; and at its pivotal end, switch arm 52 is connected through a resistor R14 and a line 56 to line 27 and the cathode terminal of the LED 10 of isolator Y.

In use, and assuming that power has been supplied by the nine volt battery to the circuit, and assuming that it is desirable to transmit an audio signal from the in/out terminal I/O only to the terminal B, switches 40 and 50 are positioned as shown in the drawing. This places the ground 28 through line 27, line 45, contact B2, switch arm 42 and line 47 in connection with the line 32. As a consequence, this completes a circuit from the DC power supply through line 24, resistor R7, line 31, resistor R8 through the LED 10 of the isolator W to the now-grounded line 32. Isolator W is therefore energized. Since line 32 is at ground potential at this time the isolator Y remains deenergized. Also at this time a circuit is completed from the DC power supply through the resistor R4, line 25, line 44, terminal B1, switch arm 41, line 53, switch arm 51, resistor R13 and line 55 to the anode side of the LED 10 of the isolator Z, the cathode of which is at this time grounded at 28, so that the isolator Z becomes energized. Since line 26 is at a positive potential at this time, the isolator X remains deenergized.

With isolators W and Z now energized, the resistance of the associated photocells 12 drop to almost zero, thus enabling the audio signal at the in/out terminal to be transmitted through the photocell 12 of the isolator Z, the resistor R2 and capacitor C2 to the terminal B. At this time the photocell 12 of isolator X is, in essence, not energized, so that its resistance remains extremely high thereby preventing the audio signal from the in/out terminal from being transmitted to terminal A. In any case, the photocell 12 of the isolator W is at this time at almost zero resistance, so that, in effect, the line 14 is at ground potential, thereby isolating terminal A from the in/out terminal.

In order to convey the signal from the in/out terminal to terminal A rather than B, the switch 40 is swung to its second position in which its arms engage the terminals A1 and A2. This is done while the switch 50 still remains in the position as shown in FIG. 1 wherein its arm 51 remains connected to switch arm 41 through the line 53. With arm 41 engaged with contact A1 the ground potential 28 is applied through line 27, line 45, contact A1, arm 41, line 53, arm 51, resistor R13 and line 55 to the line 26, thereby placing the cathode of the LED 10 of the isolator X at ground potential. A DC current therefore is supplied through resistor R4, line 25, resistor R5 and the LED 10 of the isolator X through line 26 to ground, thereby energizing isolator X. Also at this time, because arm 42 is engaged with contact A2, a circuit is completed from the DC power supply through line 24, resistor R7, line 46, contact A2, switch arm 42, and line 47 to line 32, thereby placing a positive potential to the anode of the LED 10 of isolator Y, the cathode which at this time is at ground potential through line 56, line 27 and line 28. The isolator Y, therefore is also energized at this time.

With isolators X and Y energized, the resistance of their respective photocells 12 drops to substantially zero, thereby placing line 16 at ground potential, and enabling the signal from the in/out terminal to pass through the now-conducting photocell 12 of isolator X to line 14 and through resistance R1 and capacitor C1 to terminal A.

If it is desired that the signal from the in/out terminal pass to both terminals A and B, switch 50 is swung from its illustrated position, into its second position in which its arm 51 is dead ended, and its arm 52 is placed in connection with line 54. This completes a circuit which shunts the DC power supply through line 24, resistor R7, line 31, line 46, contact A2, line 54, switch arm 52, resistor R14, line 56 and line 27 to the grounded line 28. This prevents the isolators W and Y from becoming energized. At this time, however, a circuit remains completed from the DC power supply through line R4, line 25, resistor R5 and LED of isolator X, line 26, resistor R6, the LED of isolator Z and line 27 to the grounded line 28. The current flow through the serially connected LED's 10 of isolators X and Z thereby energizes both of these isolators so that the resistances of their respective photocells 12 collapse, thereby enabling the signal from the in/out terminal to be transmitted through both of these photocells and ultimately to the audio terminals A and B.

In view of the foregoing, it will be readily apparent that the present invention provides a relatively simple and inexpensive means for selectively conveying audio signals through the in/out terminal to either audio terminal A or B, or to both, if desired. Conversely, it will be readily apparent to one skilled in the art that audio signals could be transmitted in the reverse direction from either terminal A or B to the in/out terminal or from each of the audio terminals A and B, simply by controlling the positions of the two switches 40 and 50. This contrasts with isolator devices of the type which might use transistors, which would permit passage of the audio signals only in one direction through the device.

It should be noted also that this device is particularly suited for use with electrical guitars, which by their nature, produce audio signals which are very low (level 100 mv or less), and which operate with very high input and output inpedances, on the order, for example, of 1 meg-ohm and 200K ohm, respectively. For this reason the associated amplifiers for such instruments require very high amounts of gain (for example 50 db). As a consequence, any voltage spike or distortion in the audio signal becomes a very loud pop or explosion when produced at the amplifier output. The most common causes of such spikes include a microphonically induced spike, which results from the mere action of the pushing of a mechanical switch mechanism for shuting off or turning on an audio signal with respect to a circuit, and also a spike which occurs as a result of the actual break for make action of the switch contacts. The speed of switching also affects the intensity of the "pop", which happens to diminish as the speed of the switch is slowed. In any case, devices of the type disclosed herein are concerned with the type of spike which normally originates with the turning on or off of an audio signal, as distinguished, for example, from the type of switching which occurs in most special effect guitar devices of the type in which switching is effected between a "dry" or direct signal, and a "wet" signal, or one that is being electronically altered. In the case of the latter type of switching a signal is always present at the output terminal, so that popping or signal spiking does not occur, as it does in the case of switching signals on or off from a given circuit as described herein.

The resistors used in the DC control portion of the illustrated circuit are provided simply for circuit limiting, so that the current draw on a single nine volt battery is minimized without adversely affecting the circuit performance. The filter capacitors C4 and C5 remove any AC ripple from the input voltage, while the regulator 21 protects the circuit from being subjected from any voltage damage resulting from a source of voltage greater than nine volts. Solely by way of example, values for the elements employed in the illustrated circuit may include 0.1 K ohms for resistors R1 and R2; 2.2 meg. ohms for R3; 1200 ohms for R4; 220 ohms for each of R5, R6, R8, R9, R11 and R12; 2.7K ohms for R7; 330 ohms for R13; and 407 ohms for R14. The capacitor ranges include 0.1 mf for capacitors C1, C2 and C3; 330 mf for C4 and C5; and 10 mf for each of the capacitors C7.

While this invention has been illustrated and described in detail in connection with only certain embodiments, it is to be understood that this application is intended to cover any such modifications as may well be in the scope of one skilled in the art, or the appended claims.

We claim:

1. An audio signal switching device, comprising
   an audio signal circuit having a pair of spaced terminals each of which is operable selectively to receive and to transmit audio signals,
   a DC control circuit optically coupled to said audio signal circuit and operable to control the passage of audio signals bidirectionally between said terminals,
   first signal generating means in said control circuit selectively operable by a power supply to produce a first signal, and
   first signal responsive switch means connected in siad audio signal circuit between said terminals and optically coupled to said first signal generating means and responsive to the appearance of said first signal to be switched thereby between a first mode in which said first switch means permits audio signals to pass in either direction between said terminals, and a second mode in which said audio signals are prevented by said switch means from passing between said terminals.

2. An audio signal switching device as defined in claim 1, wherein said first signal generating means comprises a first light emitting diode, and said first signal responsive means comprises a first photoresistor connected in said audio circuit between said terminals and optically coupled to said first diode.

3. An audio signal switching device as defined in claim 1, including
   a third terminal in said audio signal circuit spaced from said pair of terminals and operable selectively to receive and to transmit audio signals,
   second signal generating means in said control circuit selectively operable to produce a second signal, and
   second signal responsive means connected in said audio circuit between said third terminal and one of said pair of terminals and optically coupled to said second signal generating means, and responsive to the appearance of said second signal to be switched thereby between a first mode in which said second switch means permits audio signals to pass in either direction between said third terminal and said one terminal, and a second mode in which the last-named audio signals are prevented by said second switch means from passing between said third and said one terminals.

4. An audio signal switching device as defined in claim 3, wherein said control circuit includes means for selectively operating one or the other of said first and second signal generating means.

5. An audio signal switching device as defined in claim 3, including means in said control circuit for selectively operating said first and second signal generating means simultaneously.

6. An audio signal switching device as defined in claim 3, wherein said first and second signal generating means comprises a first pair light emitting diodes mounted in said control circuit for selective energization, said first and second signal responsive means comprises a first pair of photoresistors connected in said audio signal circuit and optically coupled to said first and said second diodes, respectively, and one of said photoresistors is connected between said pair of terminals, and the other photoresistor is connected between said third terminal and said one terminal.

7. An audio signal switching device as defined in claim 6, including means in said audio circuit operable selectively to ground said third terminal, when audio signals are passing between said pair of terminals, and to ground the other of said pair of terminals, when audio signals are passing between said third terminal and said one terminal.

8. An audio signal switching device as defined in claim 6, including
 - a second pair of light emitting diodes connected in said control circuit for selective energization,
 - a second pair of photoresistors connected in said audio circuit in optically coupled relation, respectively, with said second pair of diodes,
 - one of said second pair of photoresistors being connected between said third terminal and ground, and the other of said second pair of photoresistors being connected between the other of said pair of terminals and ground, and
 - means in said control circuit for selectively energizing one or the other but never both of said second pair of diodes, thereby selectively to ground one of said third and said other terminals, respectively.

9. An audio signal switching device as defined in claim 8, including a third pair of light emitting diodes each of which is connected in parallel with one of said first pair of diodes, and operative, when energized, to provide a visual indication of the operation of the diode connected in parallel therewith.

10. An audio signal switching device as defined in claim 3, wherein said control circuit includes a first manually operable switch movable from a first to a second position, and operative in said second position to effect simultaneous operation of said first and second signal generating means, thereby to permit passage of audio signals simultaneously between said pair of terminals and between said third and said one terminal.

11. An audio signal switching device as defined in claim 10, including a second manually operable switch in said control circuit movable between first and second positions, and operative when said first manually operable switch is in its first position, to energize said first signal generating means when in one of its two positions, and to energize said second signal generating means, when in the other of its two positions.

12. An audio signal switching device for selectively routing audio signals bidirectionally along one or both of two signal paths in an audio circuit, comprising
 - a control circuit having a DC power supply and a pair of selectively energizable signal generators,
 - an audio signal circuit having a pair of signal responsive switches connected in respectively different signal paths in said audio signal circuit normally to block the passage of audio signals along said paths, when said generators are deenergized, and operative to permit the passage of audio signals bidirectionally along said paths, when said signal generators are energized,
 - means including a first switch in said control circuit movable selectively between first and second positions, and operative, when said first switch is in its second position, to supply power to both of said generators, thereby to permit the passage of audio signals along both said paths, and
 - means including a second switch in said control circuit movable between first and second positions, and operable, when said first switch is in its first position selectively to energize one or the other of said generators,
 - each of said signal responsive switches comprising variable resistance devices operable to block the passage of audio signals in its associated circuit path without physically opening said associated path.

13. An audio signal switching device as defined in claim 12, wherein said signal generators are optically coupled to said signal responsive switches.

14. An audio signal switching device as defined in claim 13, wherein said signal generators are light emitting diodes and said signal responsive switches are photoresistors, each of which is optically coupled to one of said diodes.

15. An audio signal switching device as defined in claim 12, wherein
 - said pair of signal generators comprise a pair of light emitting diodes connected in said control circuit between said power supply and said first and second switches,
 - said pair of signal responsive switches comprise a pair of photoresistors connected in said audio signal circuit paths in optically coupled relation to said diodes, and
 - said first switch is operative, when in its second position, to connect said diodes in series between said power supply and ground thereby simultaneously to energize said diodes.

16. An audio signal switching device as defined in claim 15, wherein said second switch is operable, when said first switch is in its first position, selectively to connect one or the other of said diodes at one side of said power supply and at the opposite side to ground, thereby selectively to energize said diodes.

17. An audio signal switching device as defined in claim 16, wherein
 - one of said signal paths comprises a first pair of terminals in said audio signal circuit interconnected at least in part by one of said photoresistors,
 - the other of said signal paths comprises a third terminal in said audio signal circuit interconnected at least in part by the other of said photoresistors with one of said first pair of terminals, and
 - said audio signal circuit includes means responsive to said second switch in said control circuit selectively to ground one of said third terminals and the other of said first pair of terminals, respectively.

* * * * *